(12) United States Patent
Chin

(10) Patent No.: US 7,754,551 B2
(45) Date of Patent: Jul. 13, 2010

(54) METHOD FOR MAKING VERY LOW $V_t$ METAL-GATE/HIGH-κ CMOSFETS USING SELF-ALIGNED LOW TEMPERATURE SHALLOW JUNCTIONS

(75) Inventor: Albert Chin, LuJhou Township, Kaohsiung County (TW)

(73) Assignee: National Chiao Tung University, Hsinchu (TW)

( * ) Notice: Subject to any disclaimer, the term of this patent is extended or adjusted under 35 U.S.C. 154(b) by 140 days.

(21) Appl. No.: 12/216,561

(22) Filed: Jul. 8, 2008

(65) Prior Publication Data

US 2009/0280630 A1   Nov. 12, 2009

(30) Foreign Application Priority Data

May 7, 2008   (TW) ............... 97116760 A

(51) Int. Cl.
*H01L 21/00* (2006.01)
*H01L 21/84* (2006.01)
*H01L 21/338* (2006.01)
*H01L 21/22* (2006.01)
*H01L 21/38* (2006.01)

(52) U.S. Cl. .................... 438/181; 438/163; 438/176; 438/558; 438/559; 257/E21.467

(58) Field of Classification Search ............... 438/163, 438/176, 181, 558, 559; 257/E21.467
See application file for complete search history.

(56) References Cited

U.S. PATENT DOCUMENTS 5,903,027 A * 5/1999 Yoshitomi et al. ........... 257/327
6,620,668 B2 * 9/2003 Lee et al. .................... 438/199
2002/0146904 A1 * 10/2002 Buynoski et al. ........... 438/682

OTHER PUBLICATIONS

C.H. Wu et al. "High Temperature stable (Ir3Si-TaN)/HfLaON CMOS with large work-function difference," in IEDM Tech. Dig., 2006, pp. 617-620.
D.S. Yu et al. "Lanthanide and Ir-based dual metal-gate/HfA1ON CMOS with large work-function difference," 2005, pp. 649-652.
X. Yu et al. "High mobiltiy and excellent electrical stability of MOSFETS's using a novel HFTaO gate dielectric," in VLSI Symp. Tech Dig-, 2004, pp. 110-111.
T. Hoffman et al. "Ni-based FUSI gates: CMOS Integration for 45nm node and beyond."in IEDM Tech Sig., 2006, pp. 269-272.
H.Y. Yu et al. "Demonstration of Ni fully germanosilicide as a PFET gate electrode candidate on HfSiON" in IEDM Tech. Dig.,2005, pp. 653-656.

(Continued)

*Primary Examiner*—Alexander G Ghyka
*Assistant Examiner*—Seahvosh J Nikmanesh
(74) *Attorney, Agent, or Firm*—Bacon & Thomas, PLLC

(57) ABSTRACT

This invention proposes a method for making very low threshold voltage ($V_t$) metal-gate/high-κ CMOSFETs using novel self-aligned low-temperature ultra shallow junctions with gate-first process compatible with VLSI. At 1.2 nm equivalent-oxide thickness (EOT), good effective work-function of 5.3 and 4.1 eV, low $V_t$ of +0.05 and 0.03 V, high mobility of 90 and 243 $cm^2/Vs$, and small 85° C. bias-temperature-instability <32 mV (10 MV/cm, 1 hr) are measured for p- and n-MOS.

3 Claims, 14 Drawing Sheets

OTHER PUBLICATIONS

K. Takahashi et al. "Dual workfunction Ni-silicide/HfSion gate stacks by phase-controlled full silicidation technique for 45nm-node LSTP and LOP devices," In IEDM Tech. Dig., 2004, pp. 91-94.

R. Kasnavi et al. "Ultra low energy arsenic implant limits on sheet resistance and junction depth," in Symp. on VLSI Tech. Dig., 2000, pp. 112-113.

* cited by examiner

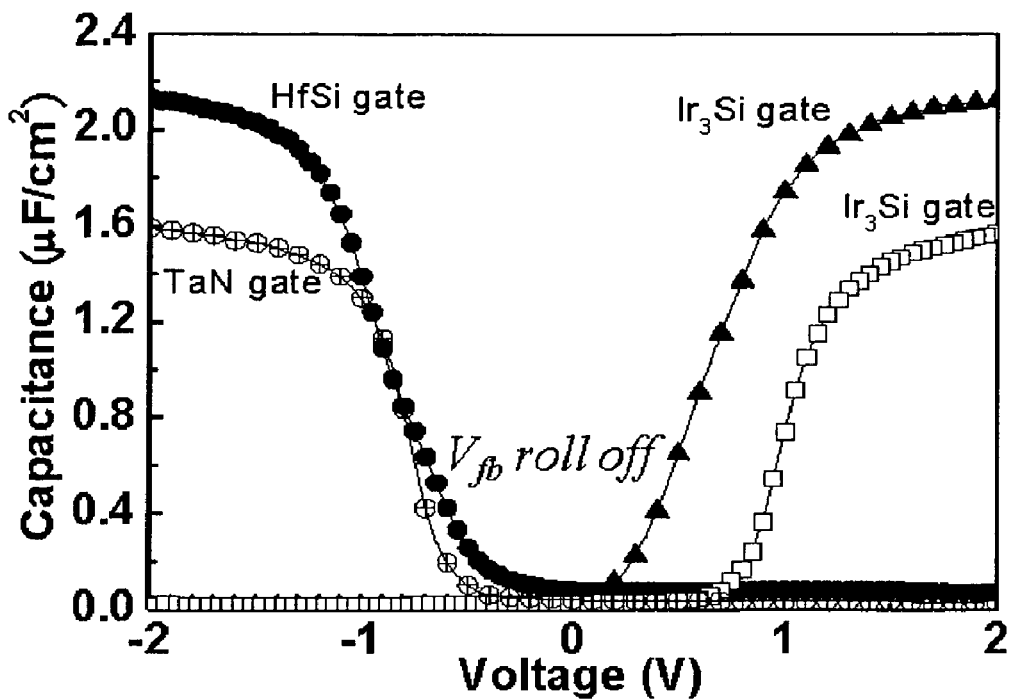
Fig. 1 -Prior Art-
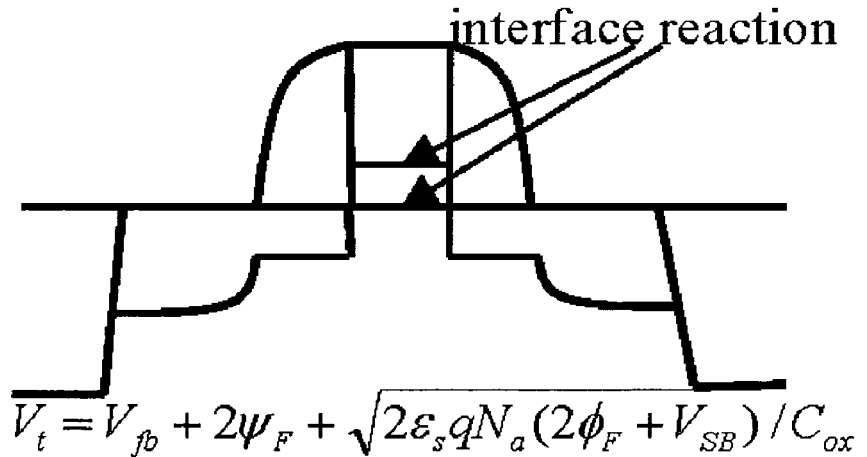
$$V_t = V_{fb} + 2\psi_F + \sqrt{2\varepsilon_s q N_a (2\phi_F + V_{SB})}/C_{ox}$$
$$V_{fb} = \Phi_{MS} - \frac{Q_f}{C_{ox}} - \frac{1}{C_{ox}} \int_0^{t_{ox}} \frac{x}{x_{ox}} \rho_{ox}(x)dx$$
$$Si + HfO_2 \xrightarrow{\Delta} SiO_x + HfO_{2-x} \quad x<2$$
Fig. 2 -Prior Art-

METHOD FOR MAKING VERY LOW $V_t$ METAL-GATE/HIGH-κ CMOSFETS USING SELF-ALIGNED LOW TEMPERATURE SHALLOW JUNCTIONS

BACKGROUND OF THE INVENTION

1. Field of the Invention

The invention relates to a method for making very low threshold voltage ($V_t$) metal-gate/high-κ CMOSFETs. More particularly, the invention relates to a method for making very Low $V_t$ [Ir—Hf]/HfLaO CMOS using self-aligned low temperature shallow junctions with gate-first process compatible with VLSI fabrication process.

2. Description of the Related Art

The undesired high $V_t$ at small equivalent-oxide thickness (EOT) is the major technology challenge for metal-gate/high-κ CMOSFETs, while the detailed mechanisms are still not clear yet [1]*-[6]* (please refer to table 1 for detail prior arts [1]*-[6]* listed in Summary of the Invention). One method to address this issue is to compensate the high $V_t$ by using proper dual metal-gates, which have an effective work-function ($\phi_{m\text{-}eff}$) lower than the target 4.1 eV for n-MOS, and higher than the needed 5.2 eV for p-MOS. Although low-temperature-formed fully-silicidation (FUSI) of Lanthanide-silicide (Yb$_x$Si) [2]* and TaC gates work well for n-MOS, the choice of an appropriate metal gate for p-MOS is especially difficult. This is because only Pt and Ir in the Periodic Table have a required work-function greater than the target 5.2 eV [2]*, but Pt is difficult to be etched by RIE. Previously, it is showed that Ir$_3$Si/HfLaON p-MOS [1]* has the needed high $\phi_{m\text{-}eff}$ of 5.08 eV and low $V_t$ of −0.1 V at 1.6 nm EOT, even after ion implant activation of a 1000° C. RTA. Unfortunately, further scaling EOT to 1.2 nm, reduces flat-band voltage ($V_{fb}$) of these devices to produce an undesirable high $V_t$. Since this approach was not successful, a fundamental understanding of the high $V_t$ and $V_{fb}$ roll-off is necessary, when EOT is scaled.

SUMMARY OF THE INVENTION

To overcome the drawbacks of the prior arts, this invention proposes a method to overcome these prior art's challenges.

In this invention, at small 1.2 nm EOT, the self-aligned and gate-first [Ir—Hf]/HfLaO p- and n-MOS showed proper $\phi_{m\text{-}eff}$ of 5.3 and 4.1 eV, low $V_t$ of +0.05 and 0.03 V, together with high mobility of 90 and 243 cm$^2$/Vs and good 85° C. reliability of small bias-temperature-instability (BTI). This good device performance was achieved by using a low-temperature (<900° C.) ultra-shallow junction (USJ) process, which lowers the interface reaction exponentially compared with a conventional 1000° C. RTA needed for ion-implantation dopant activation. The process temperature can even decrease to 650° C. for n-MOSFET using Ni/Sb SPD, where good device performances of low $V_t$ of 0.14 V and mobility of 209 cm$^2$/Vs are still obtained. Besides, the measured USJ depth ($X_j$) was only 9.5~20 nm for p$^+$/n case. The $X_j$ for n$^+$/p was 23~35 nm, better than that for a 1 keV As$^+$ implant [7]* at the same sheet resistance ($R_s$). This is due to a reduction of defect-assisted diffusion arising from ion implant damage. These results compare well with previous work [1]*-[6]*, and display a lower $V_t$ and smaller EOT, with a self-aligned USJ and gate-first process that is compatible with VLSI. This method included depositing HfLaO using PVD [1]*, a post-deposition anneal, and TaN/Ir and TaN/Hf deposition. After gate patterning, self-aligned 5 nm Ga or 10-nm-Ni/5-nm-Ga (with top 100 nm SiO$_2$ capping layer) was deposited for p-MOS, followed by 550~900° C. RTA solid-phase diffusion (SPD). For n-MOS, self-aligned H$_3$PO$_4$ was spun deposited, transformed to P$_2$O$_5$ at 200° C. and SPD at 850~900° C. RTA. Such wet H$_3$PO$_4$ spray and doping processes are used for commercial Si solar cell manufacture. Alternatively, the source-drain contact for n-MOS can be formed by 10-nm-Ni/5-nm-Sb SPD at lower temperature of 600~700° C. RTA. Finally, source-drain metal contacts were added. For comparison, [Ir$_3$Si—Hf$_x$Si]/HfLaON CMOS using B$^+$ and As$^+$ implant and 1000° C. RTA were also fabricated.

TABLE 1

Comparison of device integrity data for various metal-gate/high-κ n- and p-MOSFETs. Both this invention and Prior Arts are listed.

| High-κ | Metal-Gate p/n | EOT nm | $\phi_{m\text{-}eff}$(eV) p/n | $V_t$(V) p/n | Process Temp. | Mobility (cm$^2$/Vs) p/n |
|---|---|---|---|---|---|---|
| This invention HfLaO | Ir/Hf | 1.2 | 5.3/4.1 | +0.05/0.03 | <900° C. SPD | 90/243 |
| This invention HfLaO | —/Hf | 1.3 | | —/0.14 | 650° C. SPD | —/209 |
| This invention HfLaON | Ir$_3$Si/Hf$_x$Si | 1.2 | 5.0/4.3 | −0.25/0.19 | 1000° C. | 86/214 |
| HfLaON [1]* | Ir$_3$Si/TaN | 1.6 | 5.08/4.28 | −0.1/0.18 | 1000° C. | 84/217 |
| HfAlON [2]* | Ir$_x$Si/Yb$_x$Si | 1.7 | 4.9/4.15 | −0.29/0.1 | 950° C./FUSI | 80/180 |
| HfTaO [3]* | —/TaN | 1.6 | —/4.6 | —/— | 1000° C. | —/354 |
| HfSiON [4]* | Ni$_{31}$Si$_{12}$/NiSi | 1.5 | ~4.8/~4.5 | −0.4/0.5 | FUSI | ~70/~240 |
| HfSiON [5]* | NiSiGe/— | 1.3 | —/— | −0.5/— | FUSI | 70/— |
| HfSiON [6]* | Ni$_3$Si/NiSi$_2$ | 1.7 | 4.8/4.4 | −0.69/0.47 | FUSI | 65/230 |

*Detail of Prior Arts: (wherein [7] will be addressed in the Detailed Description of the preferred Embodiment)

[1] C. H. Wu, B. F. Hung, Albert Chin, S. J. Wang, W. J. Chen, X. P. Wang, M.-F. Li, C. Zhu, Y. Jin, H. J. Tao, S. C. Chen, and M. S. Liang, "High temperature stable [Ir3Si—TaN]/HfLaON CMOS with large work-function difference," in IEDM Tech. Dig., 2006, pp. 617-620.

[2] D. S. Yu, A. Chin, C. H. Wu, M.-F. Li, C. Zhu, S. J. Wang, W. J. Yoo, B. F. Hung and S. P. McAlister, "Lanthanide and Ir-based dual metal-gate/HfAlON CMOS with large workfunction difference," in IEDM Tech. Dig., 2005, pp. 649-652.

[3] X. Yu, C. Zu, X. P. Wang, M.-F. Li, A. Chin, A. Y. Du, W. D. Wang, and D. L. Kwong, "High mobility and excellent electrical stability of MOSFETs using a novel HfTaO gate dielectric," in VLSI Symp. Tech. Dig., 2004, pp. 110-111.

[4] T. Hoffmann, A. Veloso, A. Lauwers, H. Yu, H. Tigelaar, M. Van Dal, T. Chiarella, C. Kerner, T. Kauerauf, A. Shickova, R. Mitsuhashi, I. Satoru, M. Niwa, A. Rothschild, B. Froment, J. Ramos, A. Nackaerts, M. Rosmeulen, S. Brus, C. Vrancken, P. P. Absil, M. Jurczak, S. Biesemans, and J. A. Kittl, "Ni-based FUSI gates: CMOS Integration for 45 nm node and beyond," in IEDM Tech. Dig., 2006, pp. 269-272.

[5] H. Y. Yu, R. Singanamalla, K. Opsomer, E. Augendre, E. Simoen, J. A. Kittl, S. Kubicek, S. Severi, X. P. Shi, S. Brus, C. Zhao, J. F. de Marneffe, S. Locorotondo, D. Shamiryan, M. Van Dal, A. Veloso, A. Lauwers, M. Niwa, K. Maex, K. D. Meyer, P. Absil, M. Jurczak, and S. Biesemans, "Demonstration of Ni fully germanosilicide as a pFET gate electrode candidate on HfSiON," in IEDM Tech. Dig., 2005, pp. 653-656.

[6] K. Takahashi, K. Manabe, T. Ikarashi, N. Ikarashi, T. Hase, T. Yoshihara, H. Watanabe, T. Tatsumi, and Y. Mochizuki, "Dual workfunction Ni-silicide/HfSiON gate stacks by phase-controlled full-silicidation (PC-FUSI) technique for 45 nm-node LSTP and LOP devices," in IEDM Tech. Dig., 2004, pp. 91-94.

[7] R. Kasnavi, P. B. Griffin, and J. D. Plummer, "Ultra low energy arsenic implant limits on sheet resistance and junction depth," in Symp. On VLSI Tech. Dig., 2000, pp. 112-113.

BRIEF DESCRIPTION OF THE DRAWINGS

FIG. 1. C-V of metal-gate/HfLaON CMOS after 1000° C. RTA. The $|V_{fb}|$ roll-off with EOT scaling indicates the importance of the interface.

FIG. 2. The $|V_t|$ increase can arise from top and bottom interface. The charged oxide vacancies in non-stoichiometric $SiO_x$ and $HfO_{2-x}$ can modify $V_{fb}$ and increase $|V_t|$.

DETAILED DESCRIPTION OF THE PREFERRED EMBODIMENT

For the best understanding of this invention, please refer to the following detailed description of the preferred embodiments and the accompanying drawings.

This invention proposes a method for making very low $V_t$ metal-gate/high-κ CMOSFETs using self-aligned low temperature shallow junctions. The metal-gate/high-κ CMOSFETs process included depositing high-κ HfLaO using PVD [1]*, a post-deposition anneal, and TaN/Ir and TaN/Hf deposition. After gate patterning, self-aligned 5 nm Ga or 10-nm-Ni/5-nm-Ga (with top 100 nm $SiO_2$ capping layer) was deposited for p-MOS, followed by 550~900° C. RTA solid-phase diffusion (SPD). For n-MOS, self-aligned $H_3PO_4$ was spun deposited, transformed to $P_2O_5$ at 200° C. and SPD at 850~900° C. RTA. Such wet $H_3PO_4$ spray and doping processes are used for commercial Si solar cell manufacture. Alternatively, similar to p-MOS case, the source-drain contact of n-MOS can also be formed by Ni/Sb SPD at 600~700° C. Finally, source-drain metal contacts were added. For comparison, [$Ir_3Si$—$Hf_xSi$]/HfLaON CMOSs using $B^+$ and $As^+$ implant and 1000° C. RTA were also fabricated [1]*.

A. $V_{fb}$ Roll-Off at Scaled EOT:

FIG. 1 shows the C-V characteristics of HfLaON CMOS after a 1000° C. RTA, where EOT of 1.6 and 1.2 nm are determined using a quantum-mechanical C-V simulation. A low $V_{fb}$ is obtained for n-MOS using an $Hf_xSi$ gate at 1.2 nm EOT; however, the $V_{fb}$ is reduced for the $Ir_3Si/HfLaON$ p-MOS. Since the same $Ir_3Si$ metal-gate was used for the HfLaON, the unwanted lower $V_{fb}$ at thinner EOT may be attributed to the higher oxide charge density as described by the $V_{fb}$ equation in FIG. 2. These charges arise from inevitable charged vacancy and dangling bonds in non-stoichiometric oxides (x<2) from interface reaction and inter-diffusion:

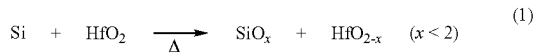

Such reactions are possible at high temperature owing to the similar bond enthalpies of 800 and 802 kJ/mol for respective $SiO_2$ and $HfO_2$ [2]*. Also at thinner EOT, only thin interfacial $SiO_2$ is permissible to meet the required high κ value for low leakage current. Since the interfacial chemical reactions follow Arrhenius temperature dependence, we aimed to develop a low temperature process to reduce such effects.

Figure 3:
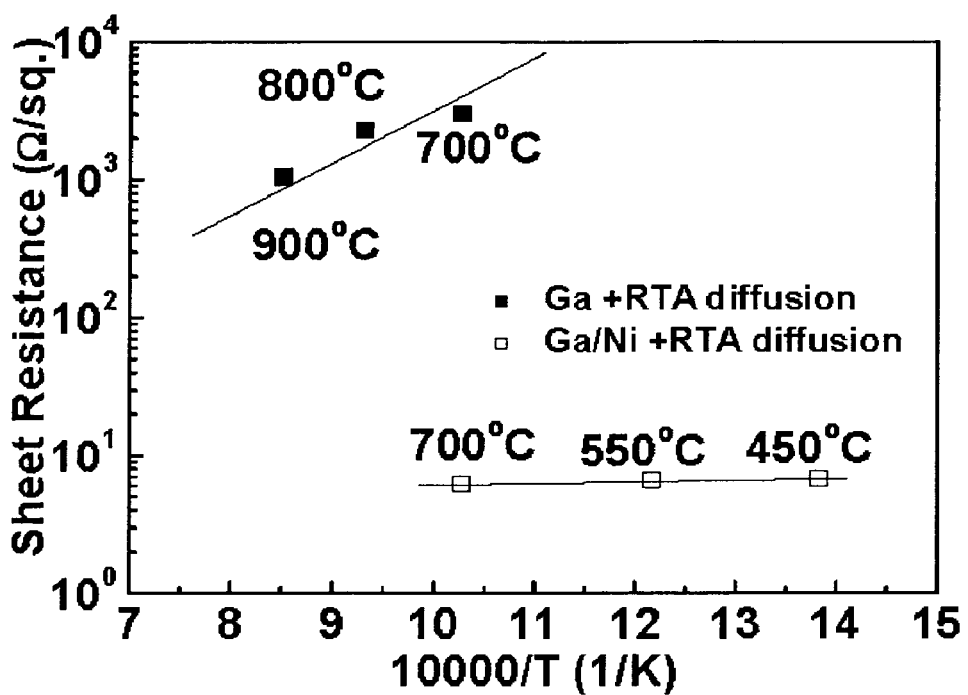
FIG. 3. $R_s$ of Ga and Ni/Ga, formed by Solid Phase Diffusion (SPD), as a function of RTA temperature.
Figure 4:
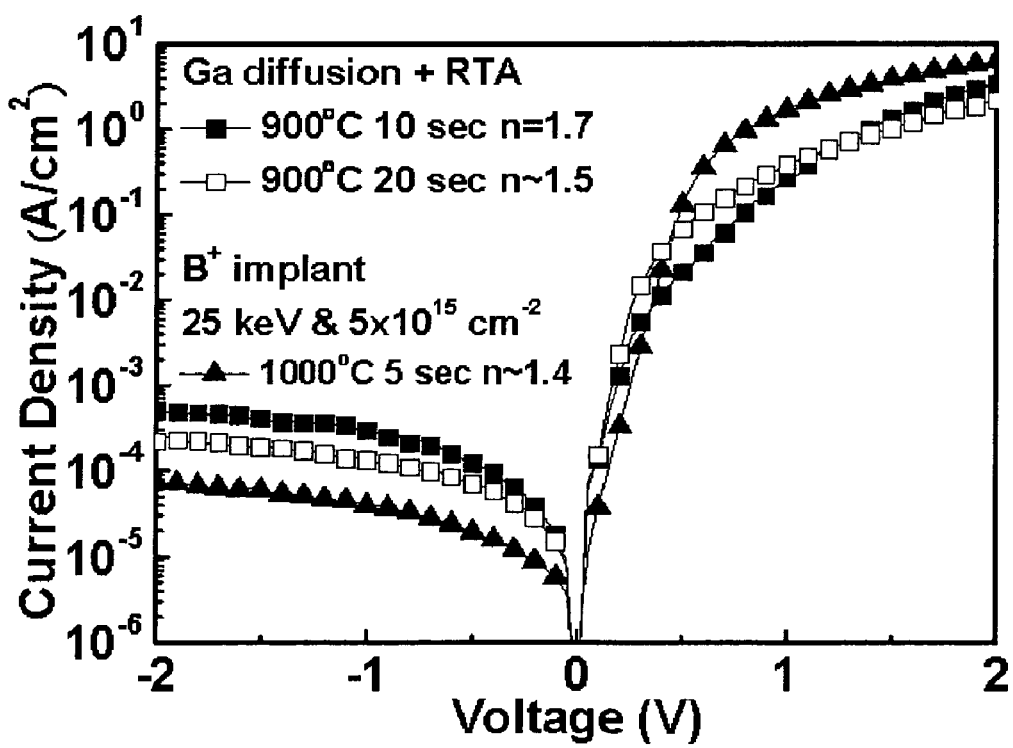
FIG. 4. J-V of $p^+/n$ junction formed by $SiO_2$/Ga SPD at 900° C. RTA, and a control $B^+$ implantation at a 1000° C. RTA.
Figure 5:
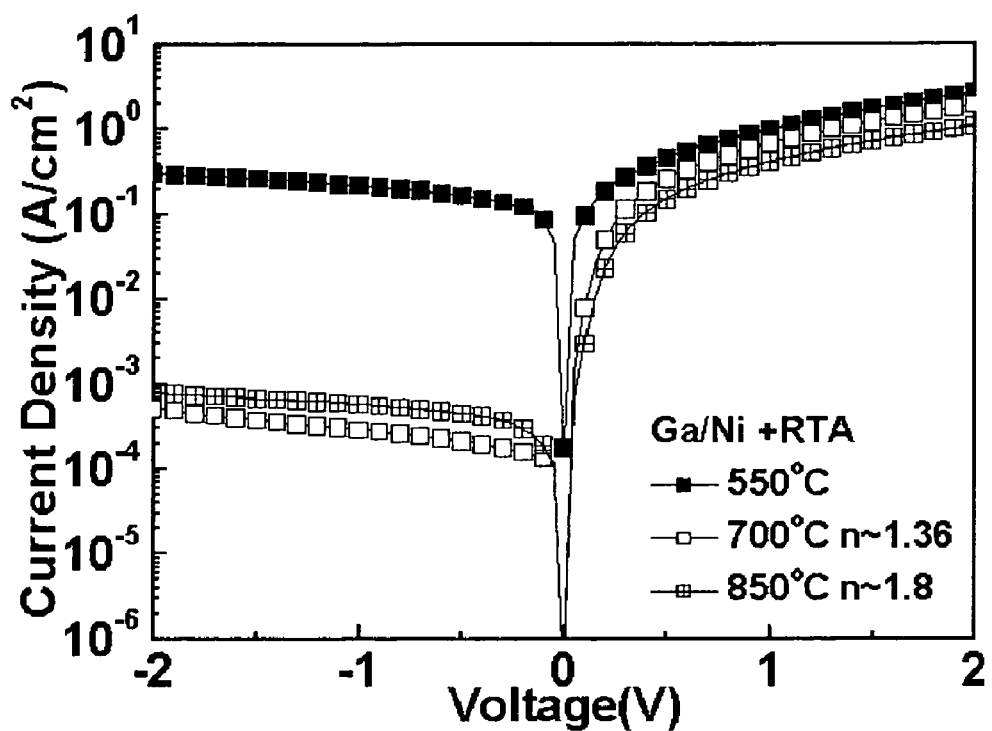
FIG. 5. J-V of $p^+/n$ junction for $SiO_2$/Ni/Ga SPD at 550~850° C. RTA. Leakage and n factors were comparable with the Ga 900° C. SPD but formed at a lower temperature.
Figure 6:
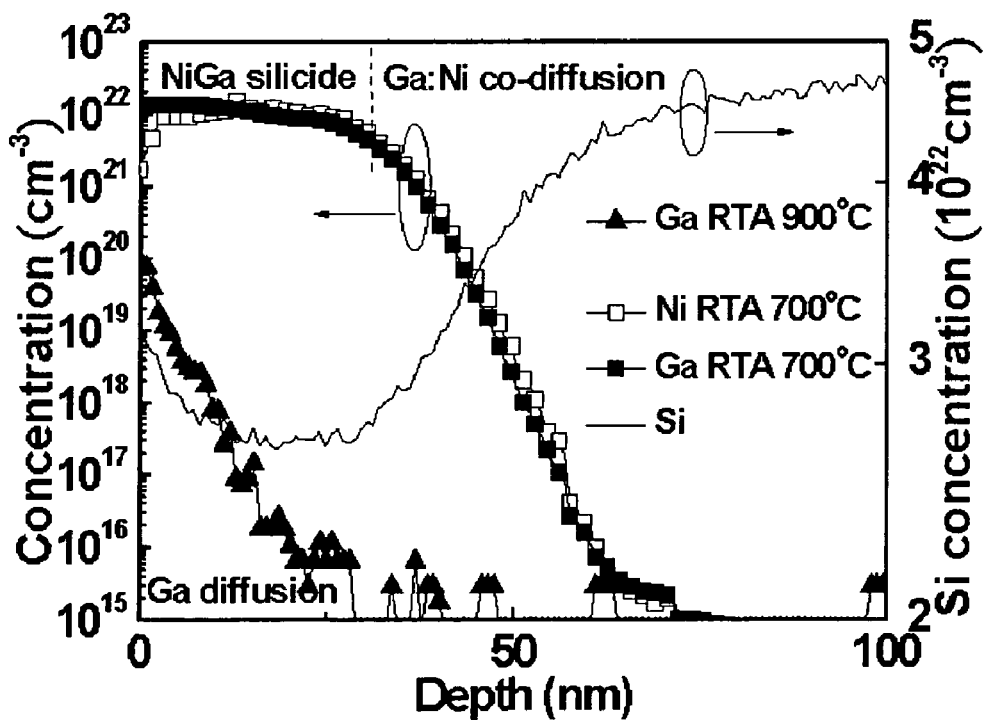
FIG. 6. SIMS profile of Ga and Ni/Ga-silicide, with ultra shallow junctions of 9.5 or 20 nm at SPD of 900° C. or 700° C. RTA. The $X_j$ is defined at $10^{18}$ cm$^{-3}$ in [7].
Figure 7:
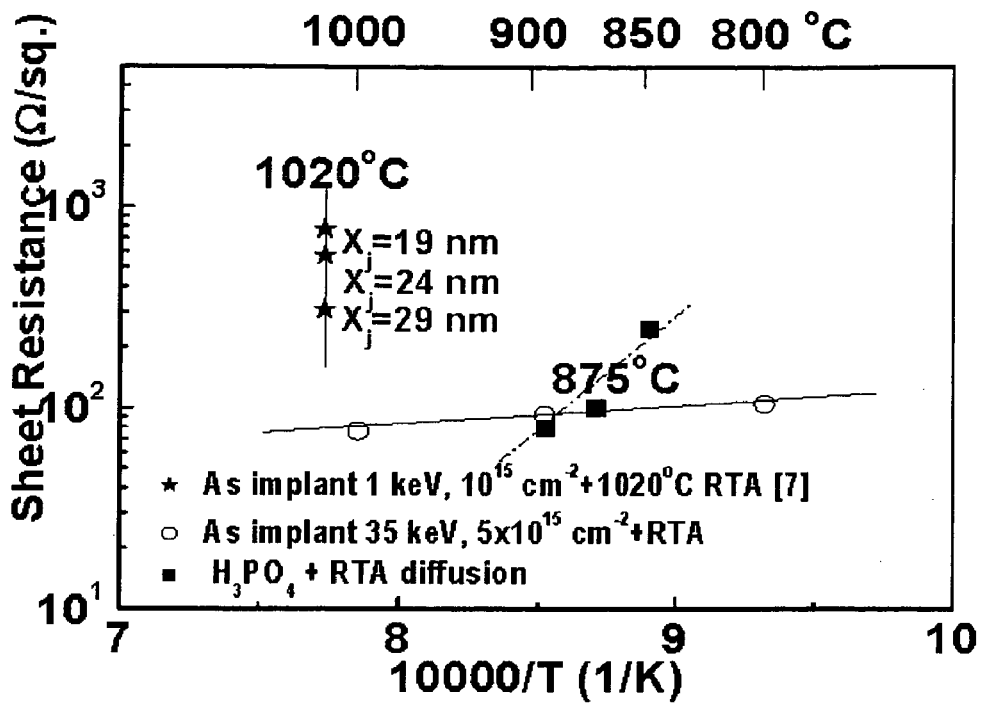
FIG. 7. Variation $R_s$ of $H_3PO_4$ spin SPD and $As^+$ implant with RTA condition. Data for the 1 keV $As^+$ implant and 1020° C. RTA are from [7].
Figure 8:
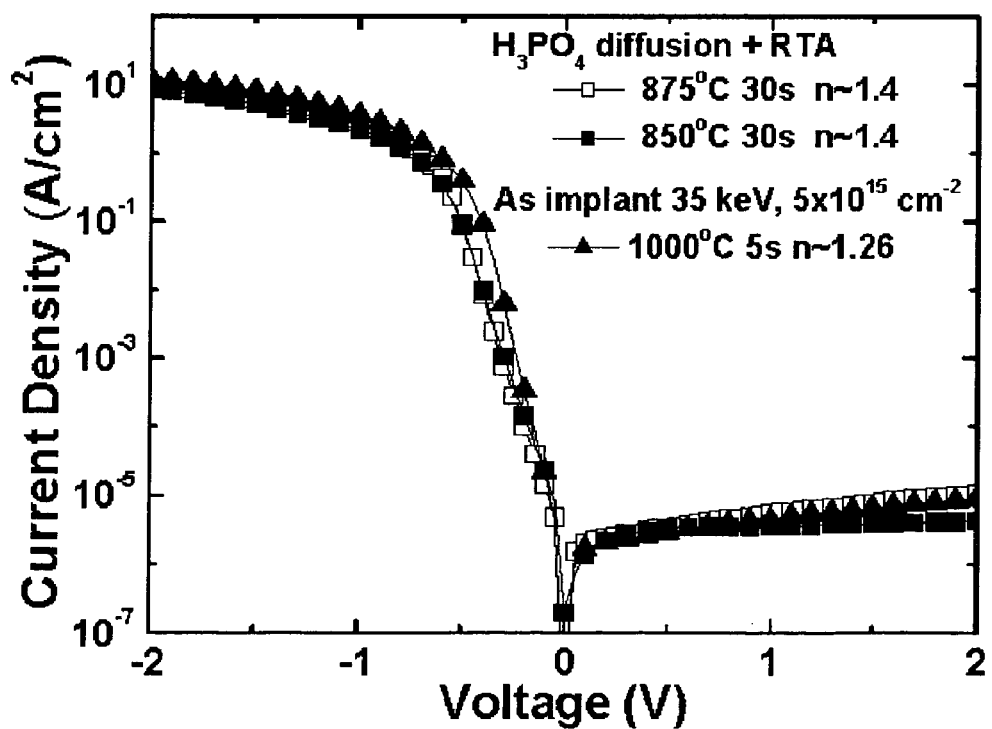
FIG. 8. J-V of $n^+/p$ junctions made by $H_3PO_4$ spin SPD at 850 and 875° C. RTA. The leakage and n similar to those for the $As^+$ implant and 1000° C. RTA case.
Figure 9:
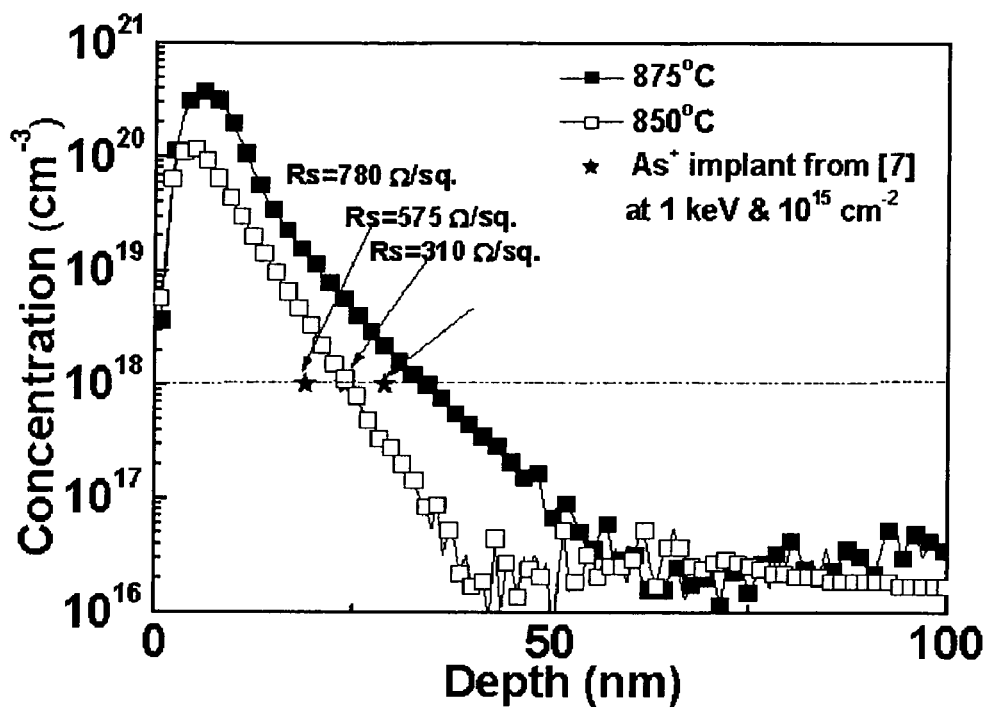
FIG. 9. Phosphorus SIMS profile for $H_3PO_4$ spin SPD, with $X_j$ of 23 and 35 nm, for 850 and 875° C. RTAs. The $X_j$ data from [7] are included for comparison.
Figure 10:
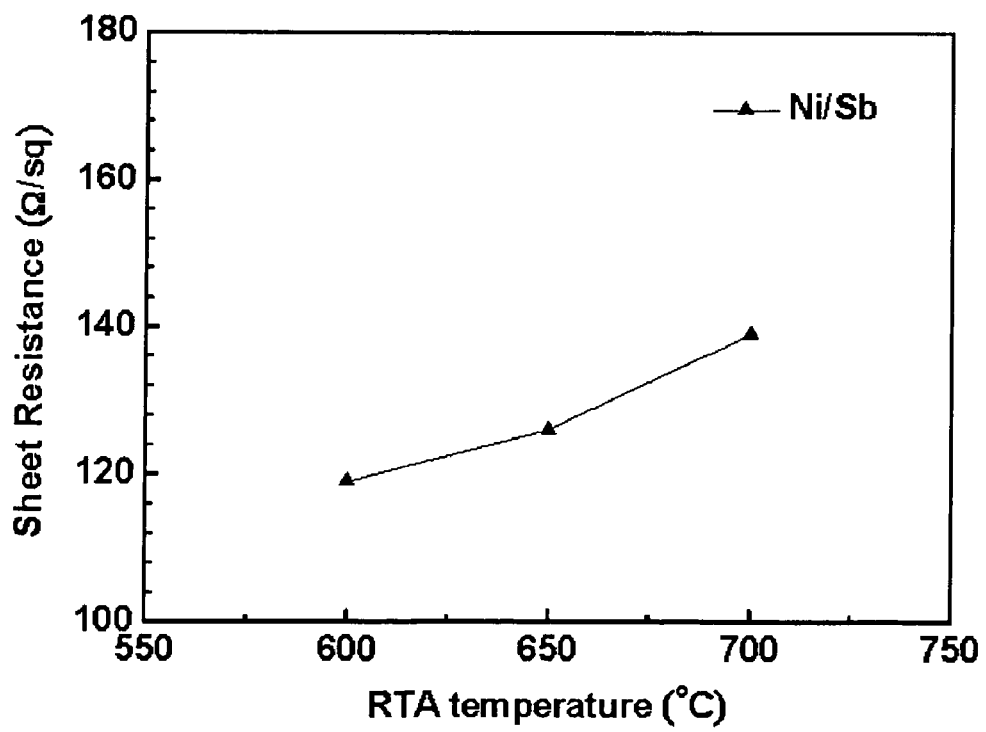
FIG. 10. $R_s$ Ni/Ga, formed by SPD, as a function of RTA temperature.
Figure 11:
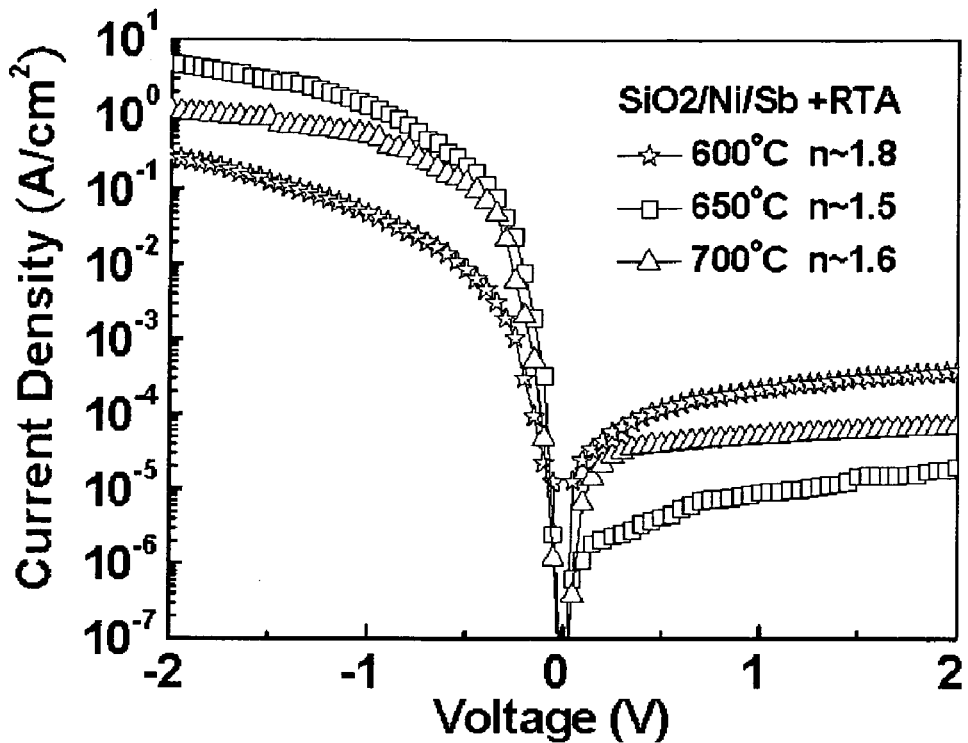
FIG. 11. J-V of $n^+/p$ junction formed by $SiO_2$/Ni/Sb SPD as a function of RTA temperature.
Figure 12:
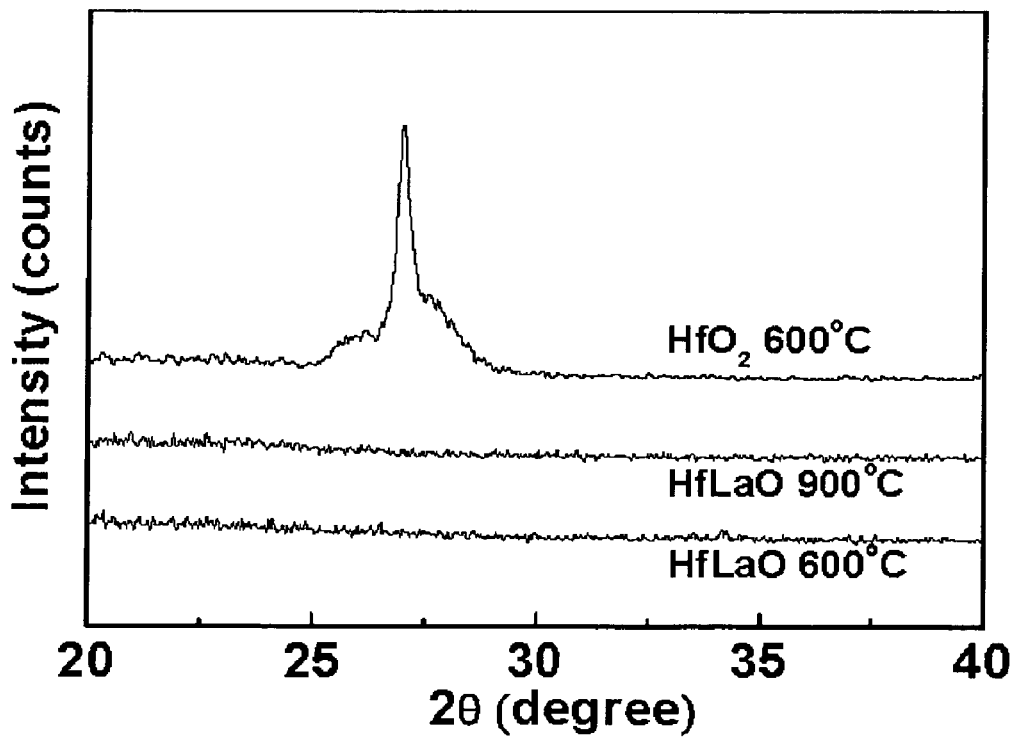
FIG. 12. Grazing incident XRD spectra of HfLaO after 600° C. and 900° C. 30 sec RTA. Amorphous structure w/o crystallization is still preserved and is important for BTI.
Figure 13:
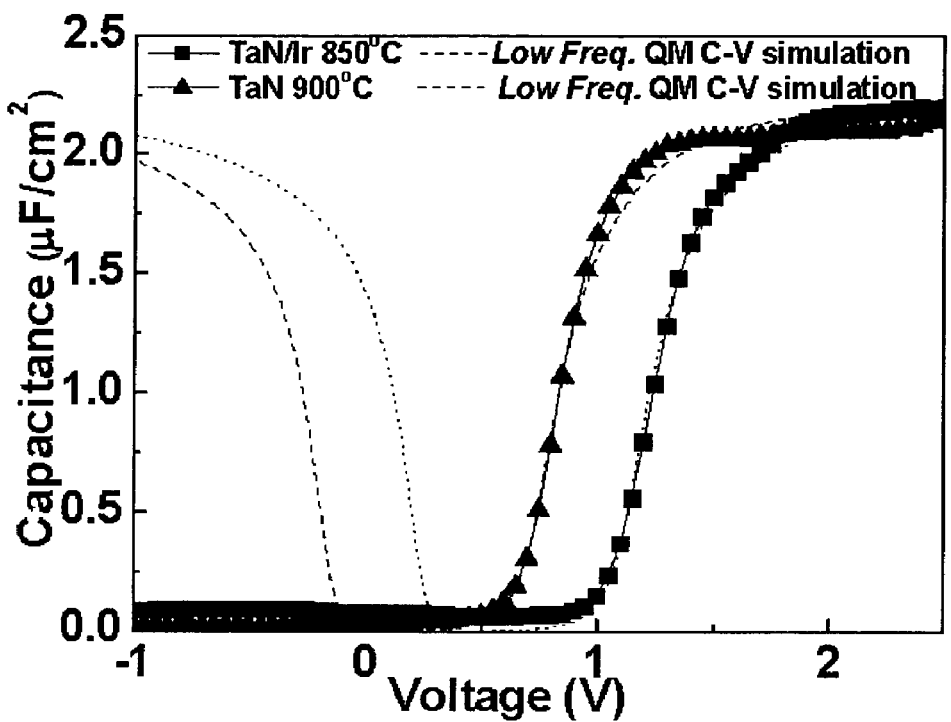
FIG. 13. C-V of HfLaO p-MOS with TaN/Ir and TaN gates, after 850 and 900° C. RTAs. $V_{fb}$ is 0.7 V higher than for $Ir_3Si$/HfLaON after a 1000° C. RTA (FIG. 1).
Figure 14:
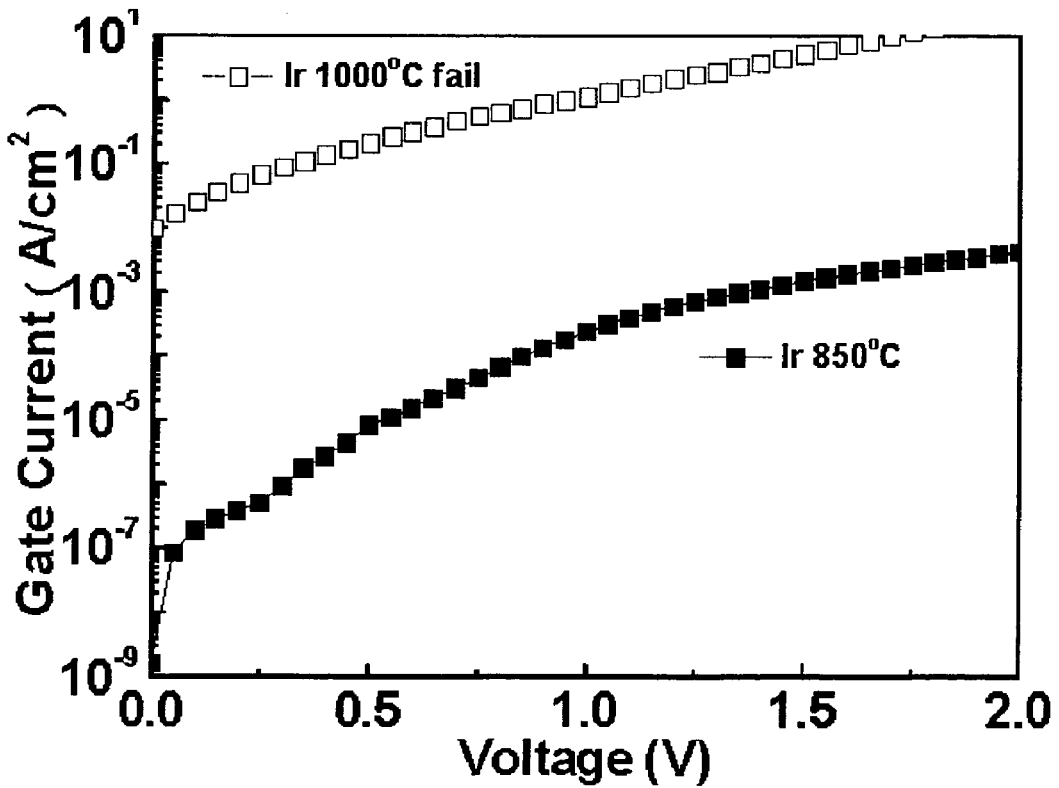
FIG. 14. J-V of HfLaO p-MOS with TaN/Ir gate after 850° C. or 1000° C. RTA. Low leakage current occurs for a 850° C. RTA but fails at 1000° C. because of metal diffusion.
Figure 15:
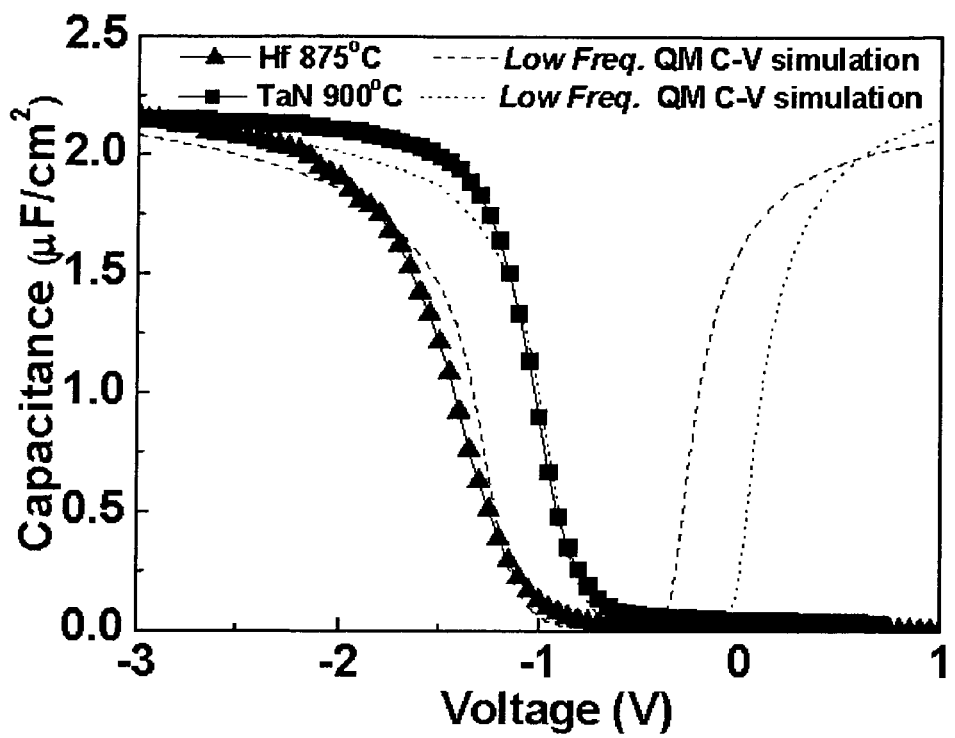
FIG. 15. C-V of HfLaO n-MOS with TaN/Hf and TaN gates after 875 and 900° C. RTAs. Data from a quantum-mechanical C-V simulation are included.
Figure 16:
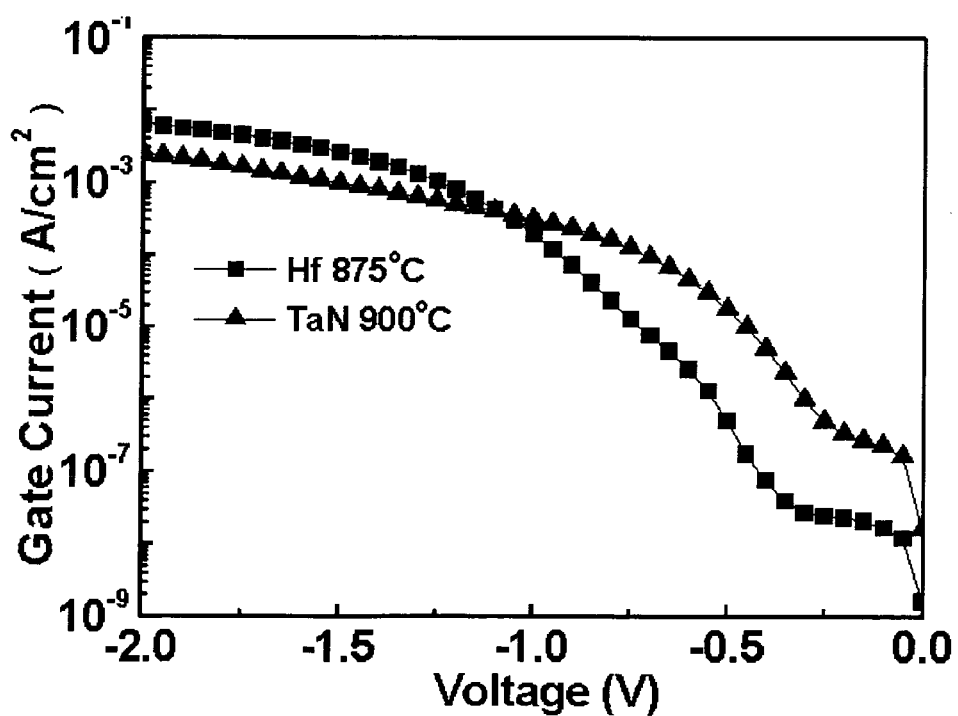
FIG. 16. J-V of HfLaO n-MOS with TaN/Hf and TaN gates, after 875 and 900° C. RTAs.

B. Low Temperature Shallow Junctions:

FIGS. 3-6 show the $R_s$, J-V and SIMS of $p^+/n$ junctions for different cases. Adding Ni to Ga SPD improves the $R_s$ through Ni—Ga co-diffusion and silicide formation while maintaining good $p^+/n$ characteristics with an ideality factor (n) of 1.36. A USJ $X_j$ of 9.5 and 20 nm was measured by SIMS for the Ga and Ni/Ga cases. FIGS. 7-9 show the $R_s$, J-V and SIMS of $n^+/p$ junctions. The self-aligned $H_3PO_4$ spin process has n of 1.4, and small leakage and a low $R_s$. A USJ $X_j$ of 23 or 35 nm was measured by SIMS after 850 or 875° C. RTA—this is better than that for a 1 keV $As^+$ implant and spike RTA at the same $R_s$ [7]*. This is due to the free from defect-assisted diffusion caused by $As^+$ implant damage. The process temperature for n-MOS can even decrease to 650° C. RTA using the Ni/Sb SPD similar to p-MOS case, where low $R_s$ of 126 ohm/sq and n of 1.5 are shown in FIGS. 10 and 11 of $n^+/p$ junctions, respectively. of $n^+/p$ junctions. This ≦900° C. process temperature is important for HfLaO in preserving its amorphous structure at 900° C. (as shown in FIG. 12) without using the nitrided HfLaON, which reduces the possible pinning at metal-gate/high-κ interface. The amorphous structure of HfLaO at 900° C. is better than crystallized $HfO_2$ for achieving good BTI, by avoiding charge trapping at poly-$HfO_2$ grain boundaries [1]*-[3]*.

C. Device Characteristics.

Figure 17:
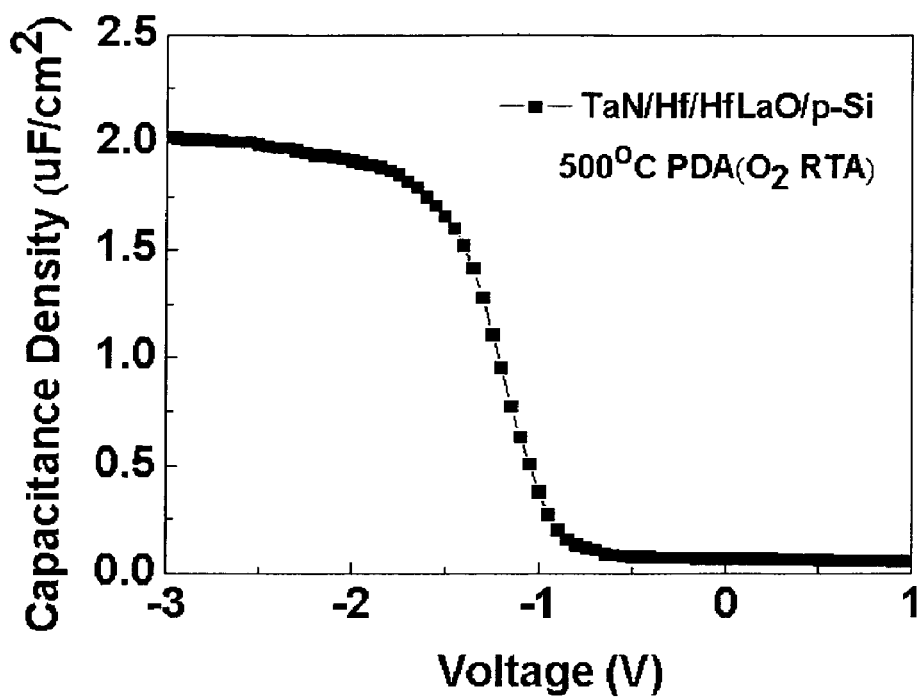
FIG. 17. C-V of HfLaO n-MOS with TaN/Hf gate using $SiO_2$/Ni/Sb SPD.
Figure 18:
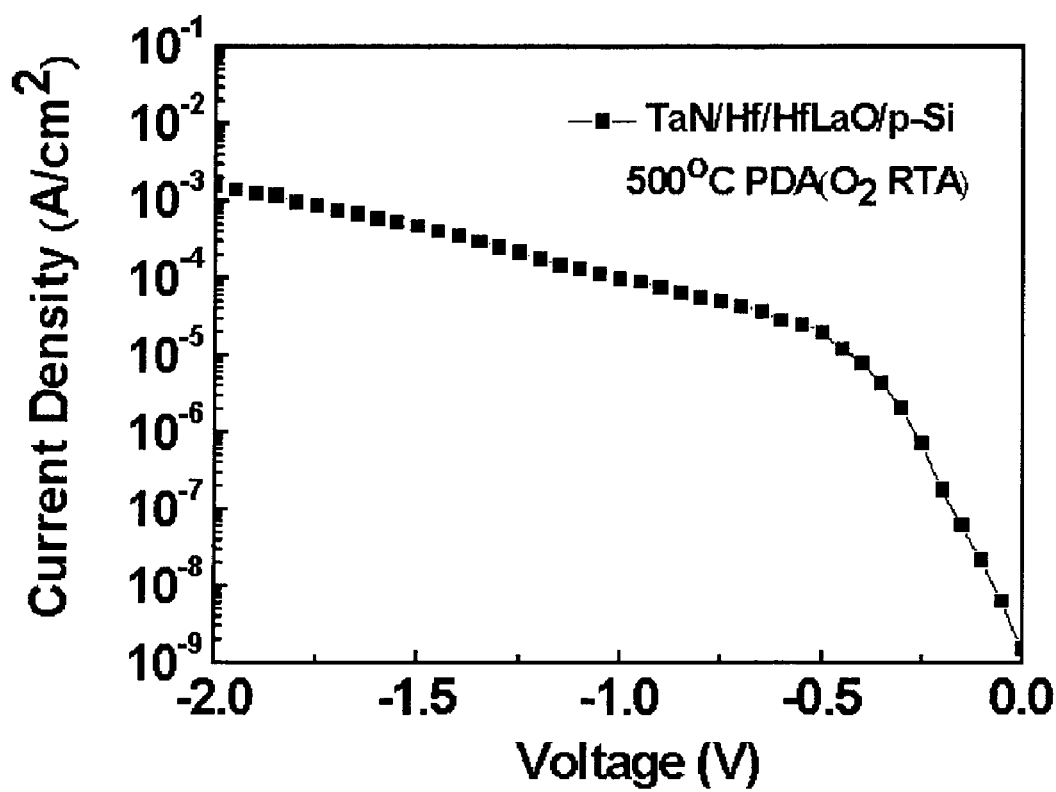
FIG. 18. J-V of HfLaO n-MOS with TaN/Hf gate using $SiO_2$/Ni/Sb SPD.
Figure 19:
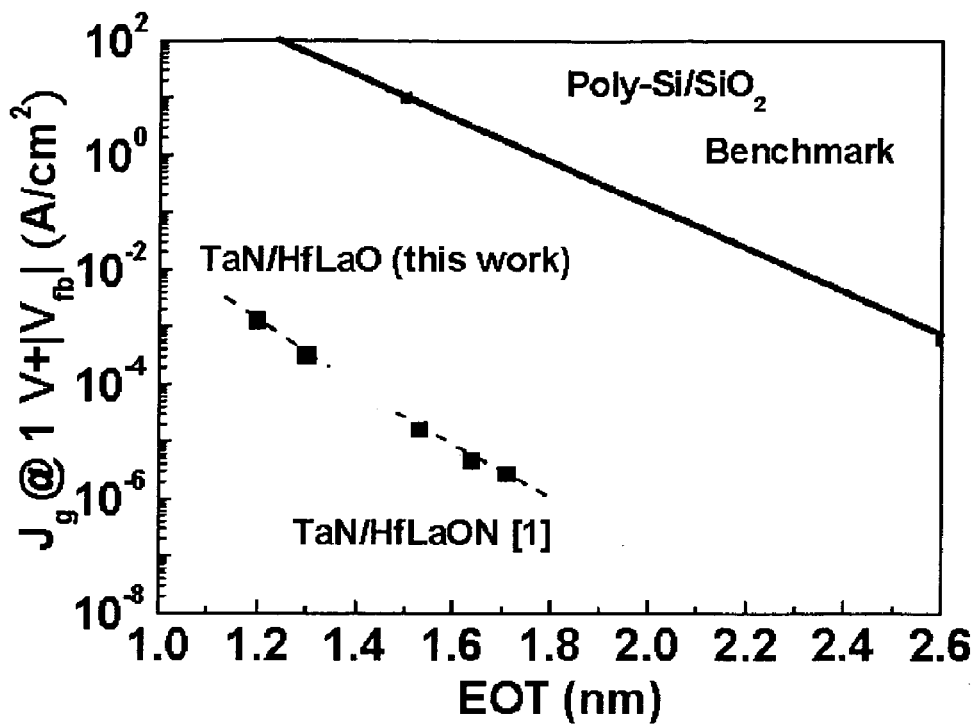
FIG. 19. Gate leakage current density for HfLaO at 1.2 nm EOT, compared with $SiO_2$ and HfLaON [1].

FIGS. 13-16 are the C-V and J-V characteristics of TaN/Ir and TaN/Hf on HfLaO devices. At 1.2 nm EOT, the gate leakage current was only $2.4 \times 10^{-4}$ and $1.8 \times 10^{-4}$ A/$cm^2$ at ±1 V Still low gate leakage current can be obtained even at very low 650° C. SPD for n-MOS at 1.3 nm EOT (FIGS. 17-18). FIG. 19 shows the J-EOT plot, where much better leakage current than $SiO_2$ is obtained at 1.2 nm EOT. Reducing the RTA temperature to <900° C. is vital for choosing proper $\phi_{m-eff}$ pure metal gate electrode, since Ir/HfLaO failed after 1000° C. RTA due to Ir diffusion through the high-κ dielectric [2]*.

Figure 20:
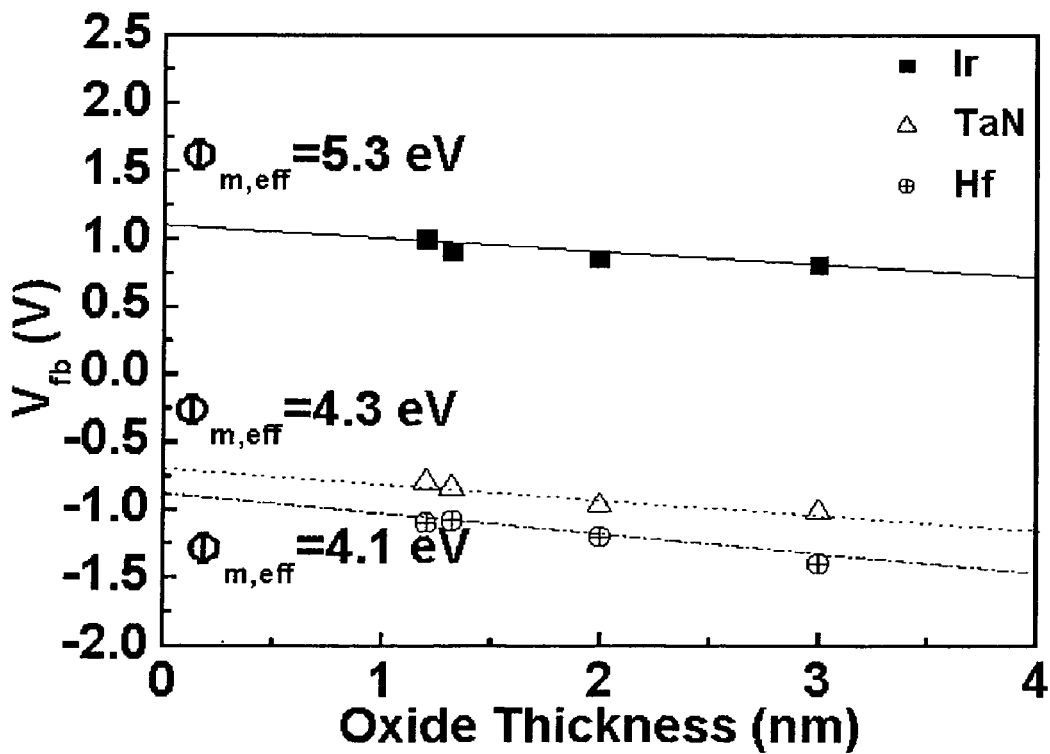
FIG. 20. $V_{fb}$-EOT for Ir, TaN and Hf gates. Effective workfunctions are 5.3, 4.3 and 4.1 eV.

Note that the $V_{fb}$ of TaN/Ir/HfLaO at 850° C. is 0.7 V larger than TaN/$Ir_3Si$/HfLaON at 1000° C. in FIG. 1. To understand this large improvement, inventors have plotted the $V_{fb}$-EOT in FIG. 20 and proper $\phi_{m-eff}$ of 5.3 and 4.1 eV are obtained for p- and n-MOS. The $\phi_{m-eff}$ at top Ir interface is only 0.3 eV higher than $Ir_3Si$ (5.0 eV) and insufficient to explain the large 0.7 V $V_{fb}$ roll-off. Since similar high-κ was used, the undesired $V_{fb}$ lowering is attributed to the charges in non-stoichiometric oxides in eq. (1)—these being created during the higher 1000° C. RTA for the $Ir_3Si/HfLaON$ case. Such oxide vacancies can be predicted theoretically, and can create lower energy traps within the $HfO_2$. This may be one of the reasons for pinning the $\phi_{m-eff}$ to Si midgap via lower energy barrier trap-assisted conduction. This interface reaction reduces exponentially when reducing the process temperature to <900° C. for the Ir/HfLaO devices.

Figure 21:
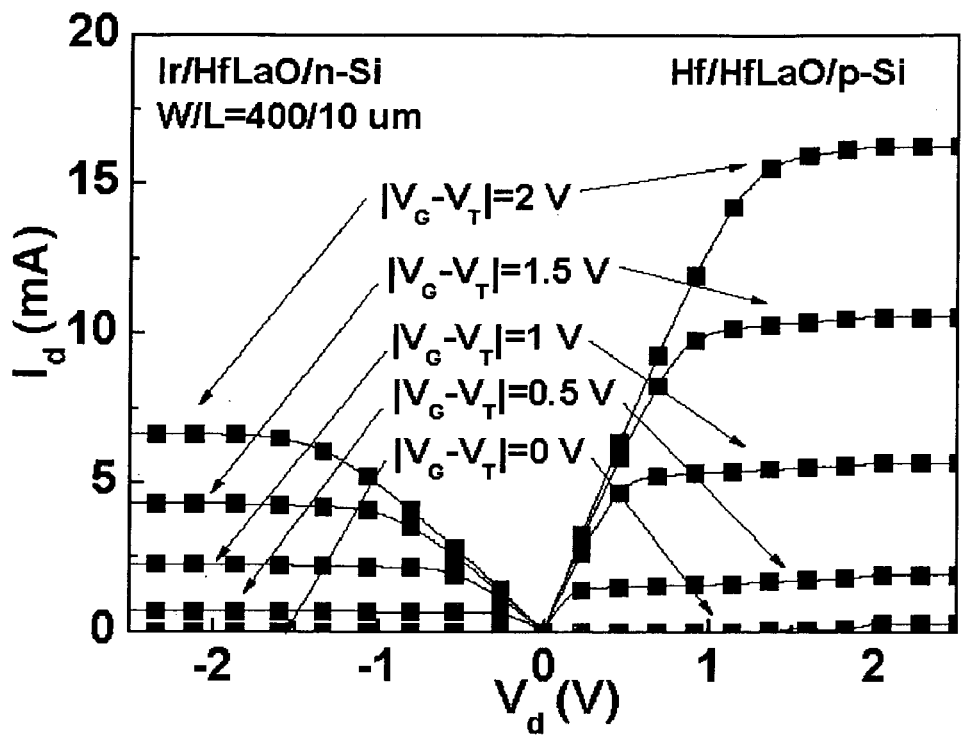
FIG. 21. $I_d$-$V_d$ of self-aligned and gate-first p- and n-MOSFETs.
Figure 22:
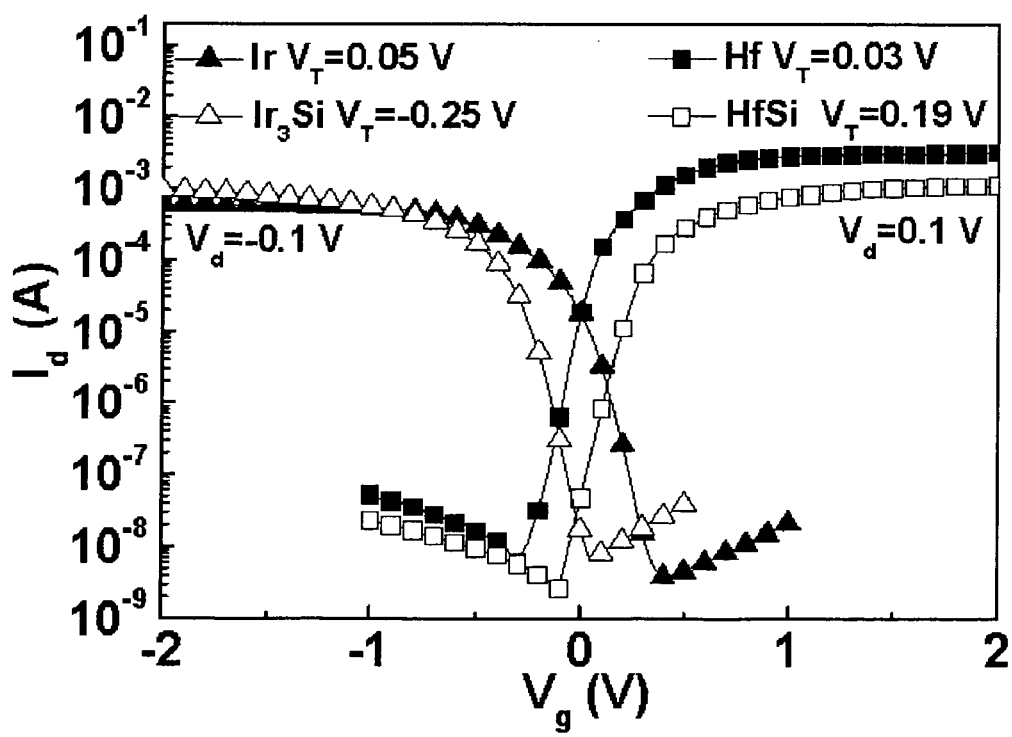
FIG. 22. $I_d$-$V_d$ of self-aligned & gate-first p- and n-MOSFETs, compared with dual gated [$Ir_3Si$—$Hf_xSi$]/HfLaON CMOS (1000° C. RTA).
Figure 23:
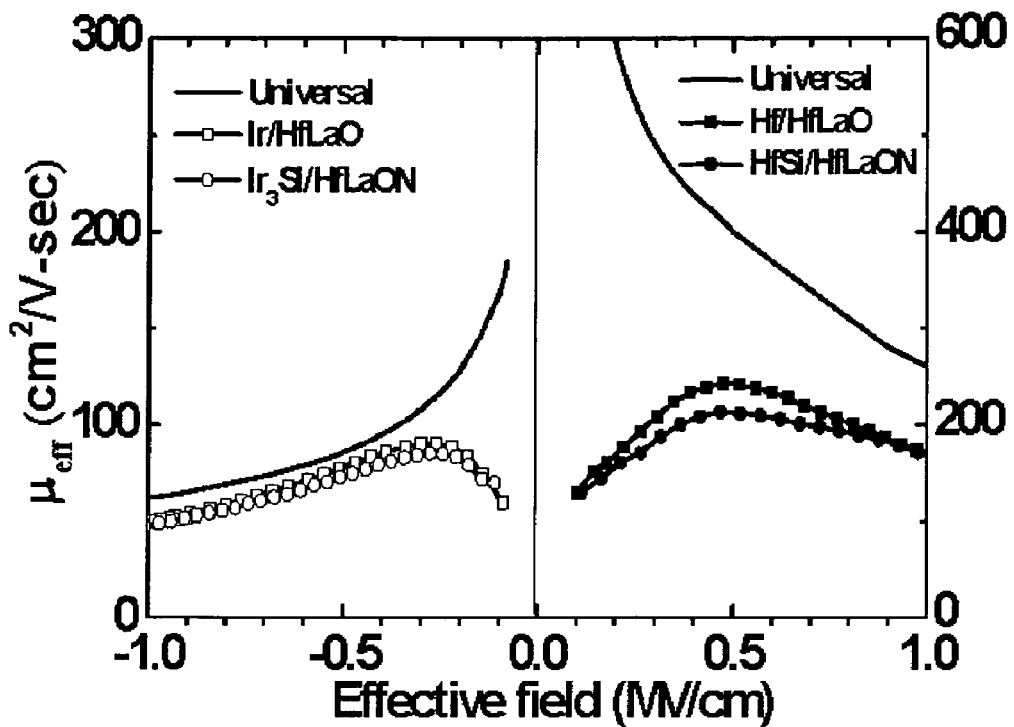
FIG. 23. Hole and electron mobility of self-aligned gate-first CMOSFETs compared with [$Ir_3Si$—$Hf_xSi$]/HfLaON CMOS (1000° C. RTA).
Figure 24:
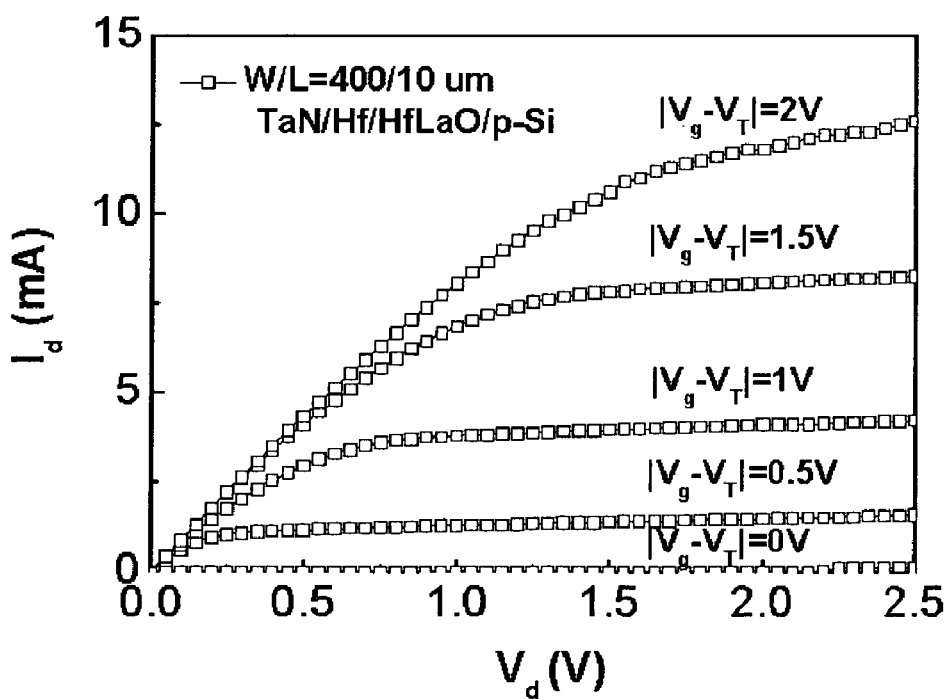
FIG. 24. $I_d$-$V_d$ of self-aligned and gate-first TaN/Hf/HfLaO n-MOSFET using $SiO_2$/Ni/Sb SPD.
Figure 25:
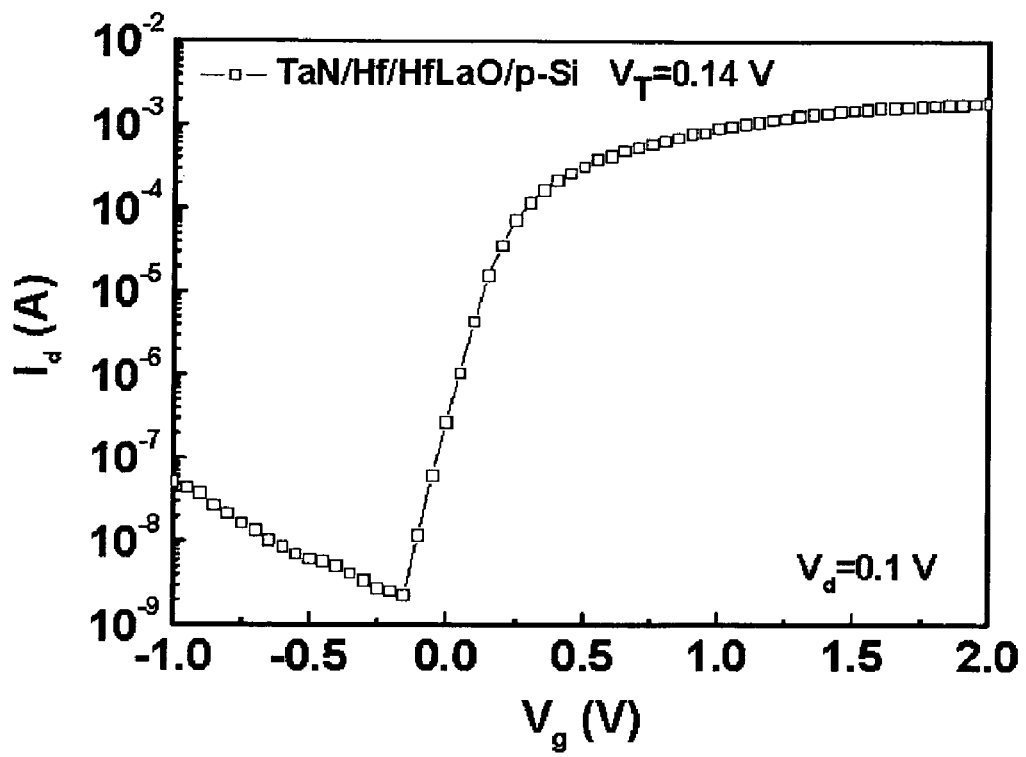
FIG. 25. $I_d$-$V_g$ of self-aligned and gate-first TaN/Hf/HfLaO n-MOSFET using $SiO_2$/Ni/Sb SPD.
Figure 26:
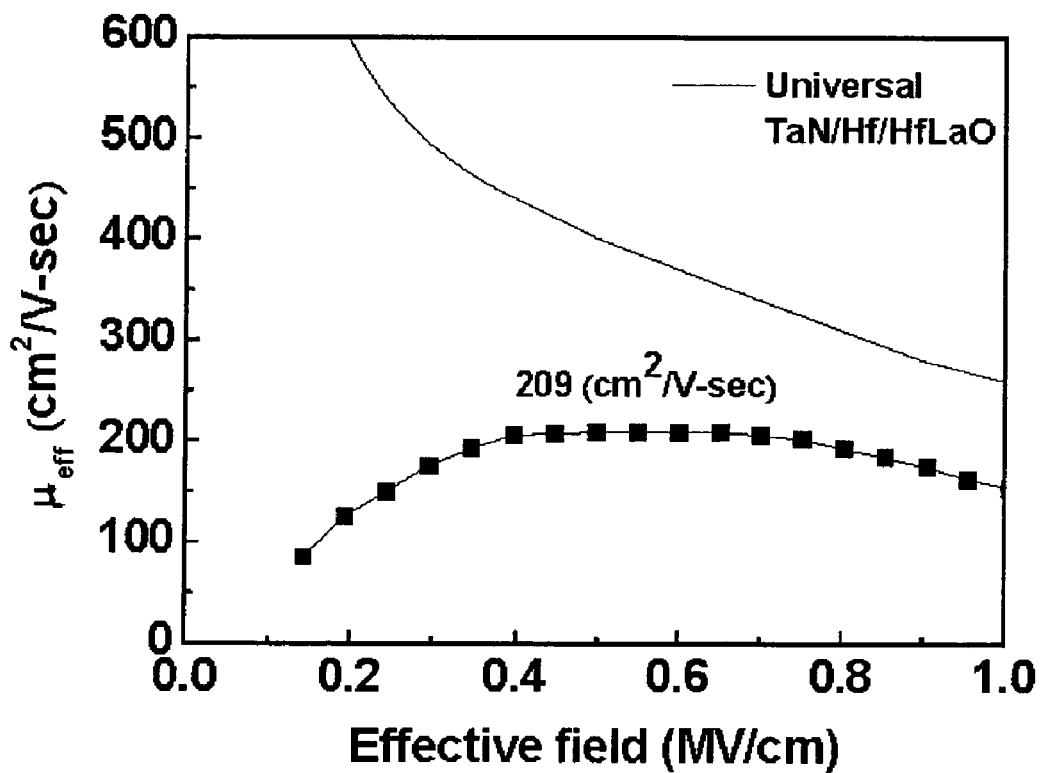
FIG. 26. Electron mobility of self-aligned and gate-first TaN/Hf/HfLaO n-MOSFET using $SiO_2$/Ni/Sb SPD.

The $I_d$-$V_d$, $I_d$-$V_g$ and $\mu_{eff}$-E characteristics of [Ir—Hf]/HfLaO p- and n-MOSFETs are shown in FIGS. 21-23, respectively. Good transistor characteristics, low $V_t$ of +0.05 and 0.03 V and high mobility of 90 and 243 $cm^2$/Vs are measured. The improved mobility, compared with 1000° C. RTA HfLaON CMOS, is consistent with lower charged vacancies associated with interfacial reactions in eq. (1). FIGS. 24-26 show the $I_d$-$V_d$, $I_d$-$V_g$ and $\mu_{eff}$-E characteristics of 650° C. SPD formed n-MOSFETs. Low $V_t$ of 0.14 V and high mobility of 209 $cm^2$/Vs are still achievable even at 650° C. SPD.

Figure 27:
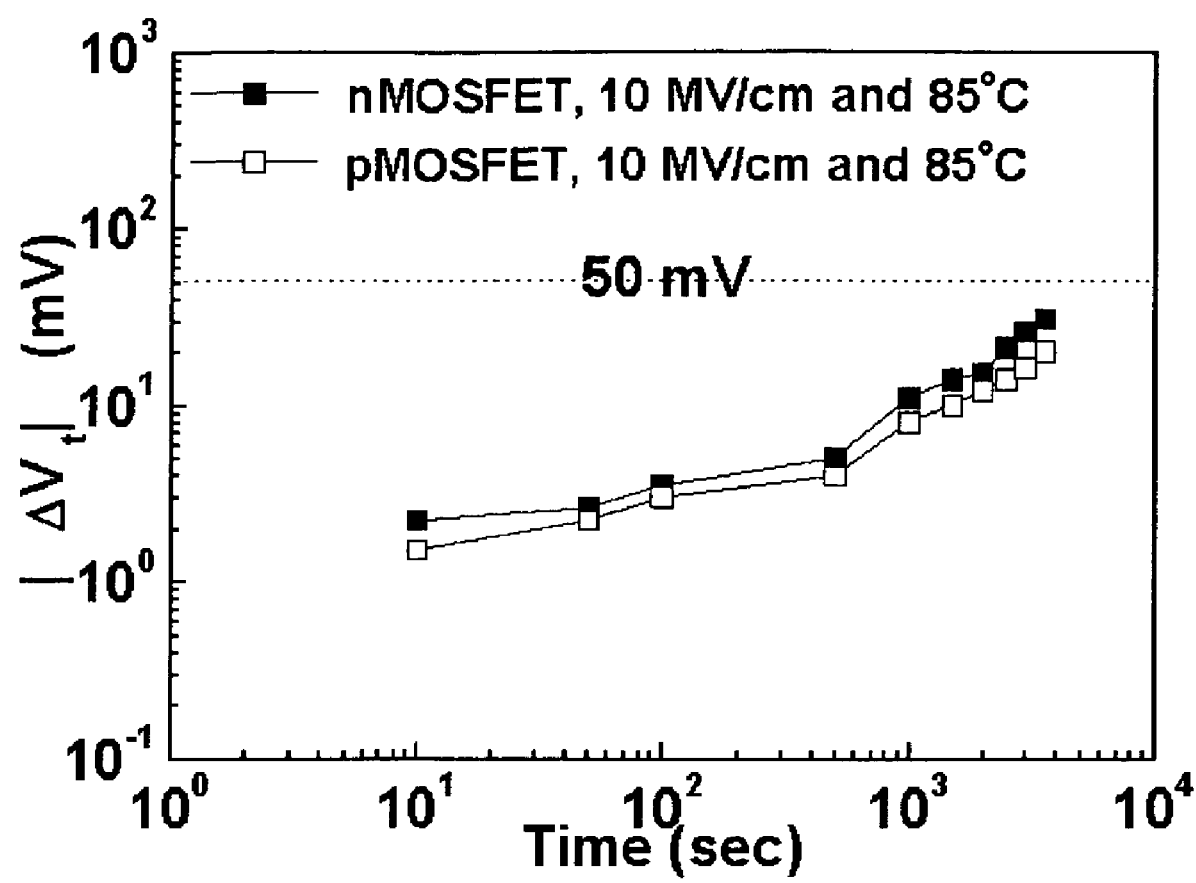
FIG. 27. The $\Delta V_t$ shift for dual-gated HfLaO CMOSFETs stressed at 85° C. and 10 MV/cm for 1 hour.

The gate reliability is shown in the BTI data of FIG. 27, where a small $\Delta V_t$<32 mV occurs for CMOS stressed at 10 MV/cm and 85° C. for 1 hr. Such good BTI reliability is due to the amorphous structure of HfLaO under ≦900° C. process temperature, which prevents BTI degradation by carrier-trapping in poly grain boundaries of $HfO_2$ case. Table 1 compares various metal-gate/high-κ CMOS data [1]*-[6]*. The merits of self-aligned [Ir—Hf]/HfLaO p- and n-MOS with SPD USJ are proper $\phi_{m-eff}$ of 5.3 and 4.1 eV, low $V_t$ of +0.05 and 0.03 V, high mobility of 90 and 243 $cm^2$/Vs, and small BTI<32 mV (85° C., 10 MV/cm & 1 hr). Further decreasing SPD temperature to 650° C. still reaches good device characteristics of n-MOSFETs with low $V_t$ of 0.14 V and high mobility of 209 $cm^2$/Vs.

In Conclusion, this invention have shown that the interfacial reactions are key factors for $V_{fb}$ roll-off that then yields an undesired high $V_t$ for highly-scaled EOT. The proposed ultra-shallow junction process, performed at ≦900° C., produced appropriate $\phi_{m,eff}$ values, small leakage and low threshold voltages for [Ir—Hf]/HfLaO CMOS devices.

Although a preferred embodiment of the invention has been described for purposes of illustration, it is understood that various changes and modifications to the described embodiment can be carried out without departing from the scope of the invention as disclosed in the appended claims.

What is claimed is:

1. A method for making very low $V_t$ metal-gate/high-κ CMOSFETs using self-aligned low temperature shallow junctions, characterized in that the method uses a low-temperature shallow junction process to lower the interface reaction of CMOSFETs under fabrication processes, which temperature is lower than 900° C., including the steps as follows:
   A. Apply high-κ gate dielectric deposition, post-deposition anneal, and dual metal-gates deposition;
   B. Apply gate patterning, wherein self-aligned Ga or Ni/Ga with top capping layer was deposited for p-MOS, followed by 550~900° C. RTA solid-phase diffusion (SPD);
   C. For n-MOS, self-aligned $H_3PO_4$ was spun deposited, transformed to $P_2O_5$ at 200° C. and SPD at 850~900° C. RTA; alternatively similar to p-MOS case, Ni/Sb with top in capping layer was deposited, followed by 600~700° C. RTA SPD.

2. The method for making very low $V_t$ metal-gate/high-κ CMOSFETs using self-aligned low temperature shallow junctions according to claim 1, wherein wet $H_3PO_4$ spray and doping processes are further used when the said method is been used for commercial Si solar cell manufacture process self-aligned $H_3PO_4$ was spun deposited, transformed to $P_2O_5$ at 200° C. and SPD at 850~900° C. RTA.

3. The method for making very low $V_t$ metal-gate/high-κ CMOSFETs using self-aligned low temperature shallow junctions according to claim 1, wherein the process temperature is between 600 to 900° C.

* * * * *